US005995821A

United States Patent [19]

Tran

[11] Patent Number: 5,995,821

[45] Date of Patent: Nov. 30, 1999

[54] DUAL-BAND GLASS-MOUNTED COUPLER FOR WIRELESS TELEPHONES IN VEHICLES

[75] Inventor: Allen Minh-Triet Tran, San Diego, Calif.

[73] Assignee: Qualcomm Incorporated, San Diego, Calif.

[21] Appl. No.: 08/842,410

[22] Filed: Apr. 23, 1997

[51] Int. Cl.[6] .............................. H04B 1/06; H03H 5/00; H01Q 1/32; H01Q 1/50

[52] U.S. Cl. ........................ 455/345; 333/24 C; 343/713; 343/863; 343/715

[58] Field of Search .................................... 455/550, 345, 455/281, 343; 343/713, 715, 702, 863; 333/24 C, 26; D14/137, 138, 140, 256, 258; 379/443

[56] References Cited

U.S. PATENT DOCUMENTS

| | | | |
|---|---|---|---|
| 4,089,817 | 5/1978 | Kirkendall | 343/713 |
| 4,839,660 | 6/1989 | Hadzoglou | 343/715 |
| 4,862,183 | 8/1989 | Blaese | 343/715 |
| 4,868,577 | 9/1989 | Wingard | 343/713 |
| 4,916,456 | 4/1990 | Shyu | 343/713 |
| 4,931,805 | 6/1990 | Fisher | 343/715 |
| 4,931,806 | 6/1990 | Wunderlich | 343/715 |
| 5,161,255 | 11/1992 | Tsuchiya | 455/345 |
| 5,283,589 | 2/1994 | Blevins | 343/715 |
| 5,471,222 | 11/1995 | Du | 343/713 |
| 5,557,290 | 9/1996 | Watanabe | 343/713 |
| 5,565,877 | 10/1996 | Du et al. | 343/715 |
| 5,646,636 | 7/1997 | Saldell et al. | 343/713 |
| 5,734,355 | 3/1998 | Watanabe | 343/859 |
| 5,847,682 | 12/1998 | Ke | 343/752 |

FOREIGN PATENT DOCUMENTS 2172148 9/1986 United Kingdom .

*Primary Examiner*—Dwayne D. Bost
*Assistant Examiner*—Tracy M. Legree
*Attorney, Agent, or Firm*—Russell B. Miller; Gregory D. Ogrod; Charles D. Brown

[57] ABSTRACT

A multiple frequency coupler establishes a low noise communication path, through the windshield of a vehicle, from a multiple frequency wireless telephone or multiple single frequency telephones, each operating at a different frequency, in the vehicle to the exterior of the vehicle. The coupler includes two preferably like-shaped internal and external elements that are oriented face to face with each other, with the windshield sandwiched between them. Each element is tapered, and the elements are juxtaposed with each other such that the wider end of one element is generally opposite the narrower end of the other. Also, a multiple frequency radiator is attached to the external element. The radiator includes plural radiating elements that are separated from each other and that are attached to a common base, with each radiating element being configured for radiating a respective frequency.

22 Claims, 9 Drawing Sheets

DUAL-BAND GLASS-MOUNTED COUPLER FOR WIRELESS TELEPHONES IN VEHICLES

BACKGROUND OF THE INVENTION

I. Field of the Invention

The present invention relates generally to wireless telephone systems, and more particularly to multi-band wireless telephones in vehicles.

II. Description of the Related Art

Wireless telephones are in widespread use because of the convenience they afford in personal communications. Wireless telephone technology continues to advance, producing better wireless communication systems while older systems nevertheless remain in use.

For example, earlier wireless telephone systems use analog communication principles and a communication frequency band of around 800 MHz, whereas more recent systems have been introduced that use digital communication principles in a frequency band around 1900 MHz. In some geographic regions, both of these systems are in use, and in some circumstances the older systems that operate around 800 MHz have been or will be converted to use digital communication principles.

In any event, because of the different frequencies used by different wireless telephone systems, the frequency at which a user's wireless telephone must operate might change from region to region. Indeed, some users in a given region might require telephones that operate at a first frequency while other users in the same region must communicate using a second frequency. In some instances, more than two frequencies might be in operation in a single area.

Recognizing the above-mentioned problem, the present invention recognizes that it is desirable to provide wireless telephones that can communicate using one of at least two (and perhaps more) frequencies, so that the telephones can be used in conjunction with more than one system. In other words, the present invention recognizes that it is desirable that one wireless telephone model be useful in more than one communication system, to increase the operational flexibility of the telephone. As a less desirable alternative, two telephones, each operating at a single respective frequency, can be provided.

It happens that to improve communication when a wireless telephone is used inside the passenger compartment of a vehicle, it is advantageous to provide a coupling device on the vehicle that, along with an associated antenna referred to as a radiator, in essence establishes a low-noise transmission path from the telephone to the air interface outside the vehicle. Among other considerations, the above factors, as inventively recognized herein, imply that a wireless telephone, when used in a vehicle, should be associated with signal transmission coupling devices that effectively transmit signals in both of two frequency bands to and from the telephone in the interior of the vehicle.

From the above discussion, however, it may be appreciated that existing wireless telephone coupling devices used in vehicles are designed for single frequency use only. Consequently, such existing devices, when used with a multiple frequency telephone or telephones, would effectively couple, to the air interface, signals in one of the telephone's frequency bands, but, unfortunately, not more. A need is thus recognized to provide a coupling device with associated multiple band antenna in a vehicle that effectively couples signals in two or more frequency bands to the air interface of a wireless telephone communication system.

Accordingly, it is a purpose of the present invention to provide a coupling device that can be associated with a vehicle for establishing a low-noise communication pathway to and from a wireless telephone inside the vehicle. Another purpose of the present invention is to provide a coupler in a vehicle that can effectively couple signals in at least two frequency bands across a window of the vehicle. Yet another purpose of the present invention is to provide a multiple (dual) band radiator in a vehicle that can effectively conduct signals, in each of two frequency bands. Still another purpose of the present invention is to provide a coupling device for coupling multiple band signals to and from a wireless telephone in a vehicle, such that the coupling device is easy to use and cost-effective to manufacture and implement.

SUMMARY OF THE INVENTION

A coupler is disclosed for establishing a communication path between a wireless telephone inside a vehicle and the exterior of the vehicle. The coupler includes an external coupling element that can be affixed to an external surface of a component (e.g., a windshield) of the vehicle. As disclosed in detail below, the external coupling element defines a base end and a tapered end, and the external coupling element is tapered from the base end to the tapered end.

Furthermore, an internal coupling element can be affixed to an inner surface of the component, windshield, and electrically connectable or coupled to the wireless telephone. The internal coupling element defines a base end and a tapered end. Importantly, the internal coupling element is oriented relative to the external coupling element with the base end of the internal element juxtaposed with the tapered end of the external element and with the base end of the external element juxtaposed with the tapered end of the internal element. Preferably, each coupling element is associated with a respective adhesive layer for affixing the element to a window.

According to principles of the present invention, the external coupling element defines a longitudinal dimension between its ends and a transverse dimension. The surface area per unit length of a first portion of the element that extends across the element in the transverse dimension is greater than the surface area per unit length of a second portion of the element that extends across the element in the transverse dimension when the second portion is nearer the tapered end than the first portion. In another sense, the external coupling element defines a base continuous in the transverse dimension and at least one arm extending longitudinally away from the base.

In one embodiment, the external coupling element includes two arms in tandem, with each arm defining a respective outer edge and a respective center edge. At least one of the edges is oriented at an oblique angle relative to the longitudinal dimension. Alternatively, a single arm can be provided which includes an outer edge having a curvature defined by an exponential function. In yet another alternative, at least one arm includes multiple segments with a first segment that is oriented generally longitudinally and a second segment contiguous to the first and bent relative thereto such that the second segment is oriented generally transversely to the first. In other words, the second segment is angled relative to the first. In this way, the element is configured for being received in a relatively small enclosure.

In further embodiments, three or more segments can be joined in series in a contiguous structure where it is desirable to form longer or more complex arm structures. Each segment in such an arm can be joined at various angles to adjacent segments, with 90 degrees being typical, but not a required angle. For example, a series of arm segments can be formed at 120 degree angles to each other. In a further alternative, an arm can be formed as a continuous curved element.

In another aspect, a dual frequency coupler for establishing a low noise communication path includes two planar elements oriented face to face with a dielectric material disposable therebetween. As intended by the present invention, the elements generally have the same configuration as each other, with each element being tapered such that each element defines a respective tapered direction. The elements are oriented relative to each other with their tapered directions being opposed. The elements generally also define a centerline along a longitudinal axis, and are aligned with each other relative to this centerline. Additionally, the elements may use differing numbers of arms, taper angles, or overall dimensions, depending on the specific application.

In still another aspect of the present invention, a method is disclosed for establishing a communication path between a wireless telephone within a vehicle and the exterior of the vehicle. The present method includes providing an external coupling element having a tapered configuration and defining a tapered direction, and likewise providing an internal coupling element having a tapered configuration and defining a tapered direction. The external coupling element is affixed to an outside surface of a window or other surface of the vehicle, and the internal coupling element is affixed to an inside surface of the window such that the tapered direction of the internal element is opposite the tapered direction of the external element. With this cooperation of structure, the window is sandwiched between the elements.

Preferably, the external coupling element is connected to a radiator having plural radiating elements separated from each other and attached to a common base. The radiating elements are configured to transmit or receive signals at the various frequencies accommodated by the coupler.

BRIEF DESCRIPTION OF THE DRAWINGS

The features, objects, and advantages of the present invention will become more apparent from the detailed description set forth below when taken in conjunction with the drawings in which like reference characters identify like elements throughout and wherein.

DETAILED DESCRIPTION OF THE PREFERRED EMBODIMENTS

Figure 1:
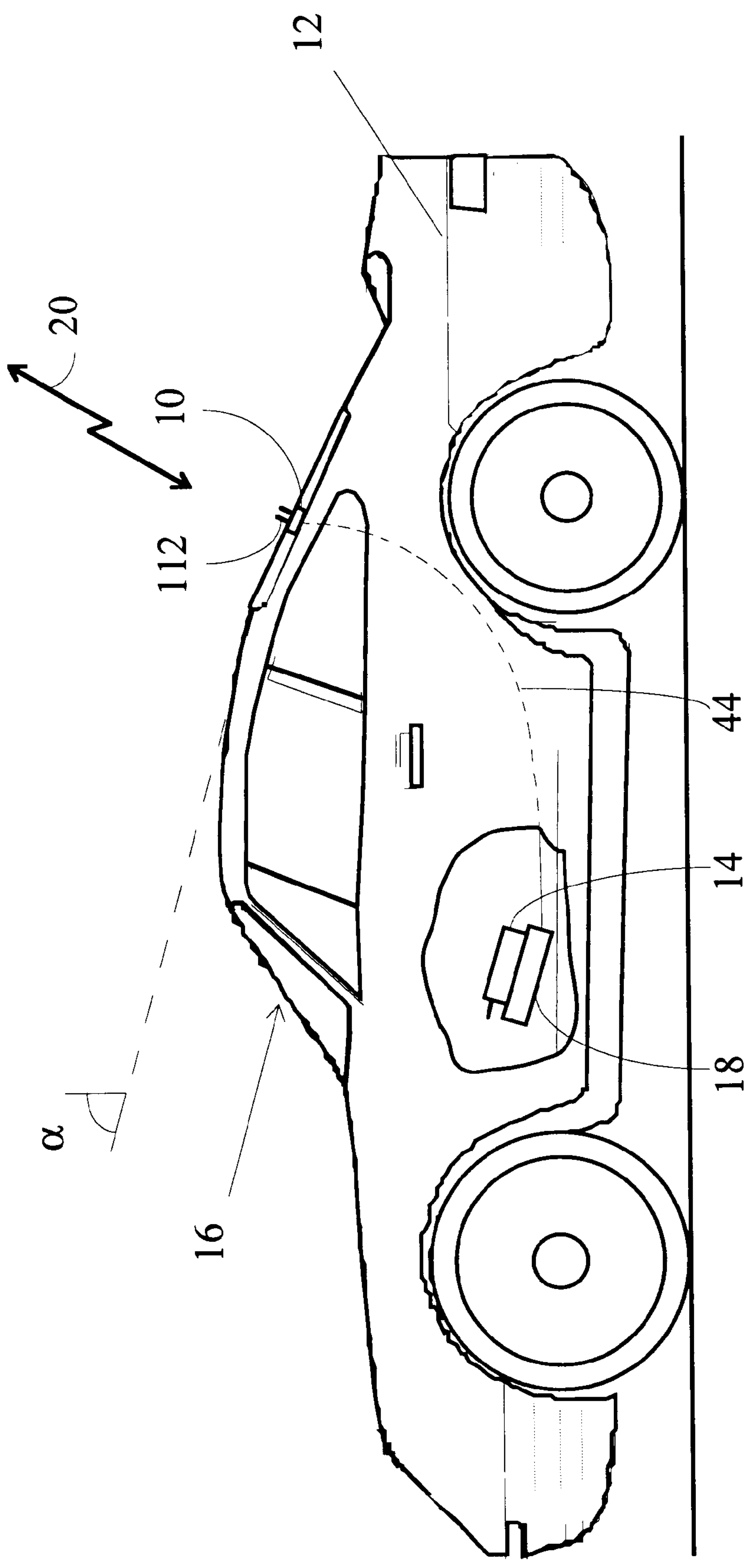
FIG. 1 illustrates a perspective view of a vehicle incorporating a coupling device and radiator according to the principles of the present invention, showing a wireless telephone cradle and telephone.

Referring initially to FIGS. 1 and 2 (2A and 2B), a coupler is shown, generally designated 10, for establishing a low noise communication path between the exterior of a vehicle 12 and a wireless device, such as a wireless telephone 14. Other wireless devices are also contemplated for use, such as message receivers and data transfer devices (e.g., portable computers, personal data assistants, modems, fax machines), which may use other types of known mechanisms to connect to the antenna coupler discussed below. In the embodiment shown in FIG. 1, telephone 14 is disposed within a passenger compartment 16 of vehicle 12. In the preferred embodiment shown, wireless telephone 14 is a dual-frequency telephone, although it can be a single frequency telephone or it can use more than two frequencies. More specifically, preferably wireless telephone 14 can transmit and receive signals in one of at least two frequency bands. Exemplary frequency bands define respective center frequencies of about eight hundred fifty nine million cycles per second and nineteen hundred twenty million cycles per second (859 MHz and 1920 MHz), which are commonly referred to as "cellular" and "personal communication services" (PCS) frequencies. However, the principles disclosed herein apply to frequency bands other than those above. It will be readily understood that the present invention may accommodate multiple telephones useable in a single cradle, with each telephone using a single respective frequency, in addition to single multi-frequency telephones. For example, where a common telephone housing structure and external configuration is used to manufacture wireless telephones which operate in different frequency bands.

Preferably, to facilitate so-called hands free communication using telephone 14, telephone 14 is positioned in a telephone cradle 18 within passenger compartment 16. Cradle 18 can include speakers and amplifiers in accordance with principles known in the art which are activated to permit a user of telephone 14 to speak into telephone 14 and to hear signals therefrom without holding or otherwise manipulating telephone 14, and to observe visual displays on telephone 14.

Accordingly, a person can use telephone 14 in cradle 18 to communicate hands free via either one of the telephone's frequencies with a wireless communication system. In FIG. 1, the wireless communication system is partially represented by an air interface 20 that is external to vehicle 12. As recognized by the present invention, however, because telephone 14 is disposed inside vehicle 12, noise, interference, and/or signal blockage that is induced by the structure of vehicle 12 can degrade the transmission and reception of communication signals which are transmitted and received by telephone 14. With this in mind, the present invention provides the inventive structure described below to establish a low-noise communication path between telephone 14 and air interface 20, and, subsequently, one or more communication systems, that is effective regardless of which frequency is used by telephone 14.

Figure 2A:
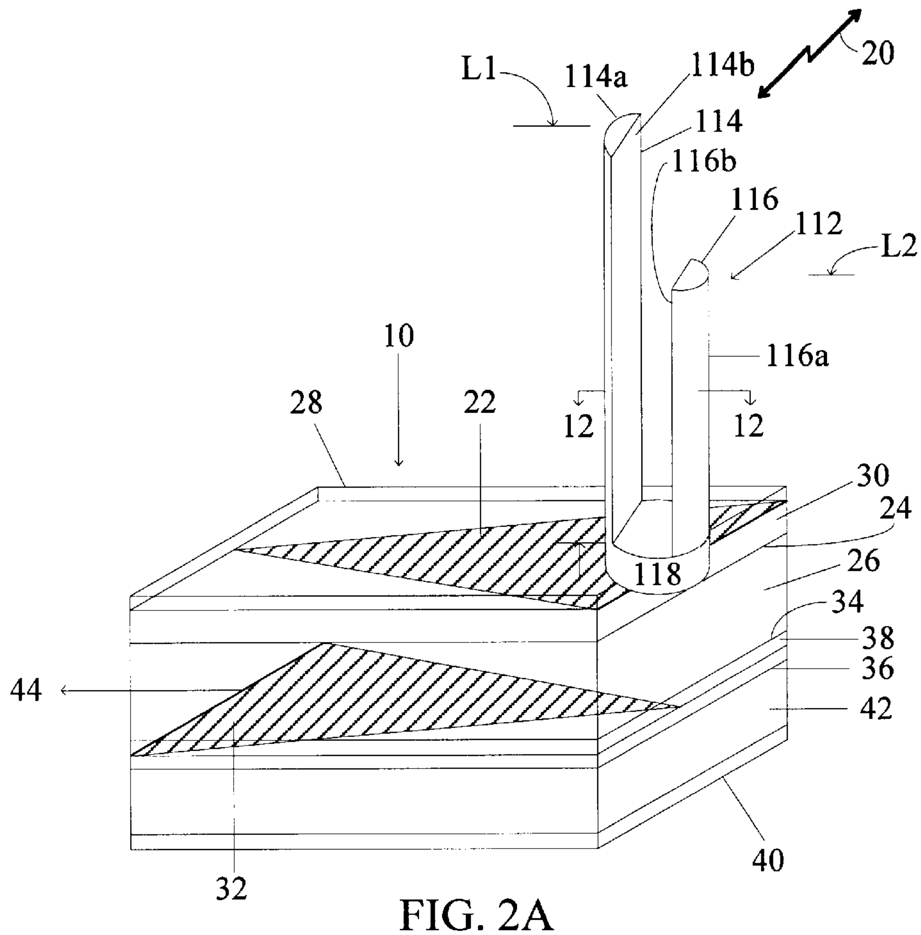
FIG. 2A illustrates a perspective view of the coupling device of FIG. 1.
Figure 2B:
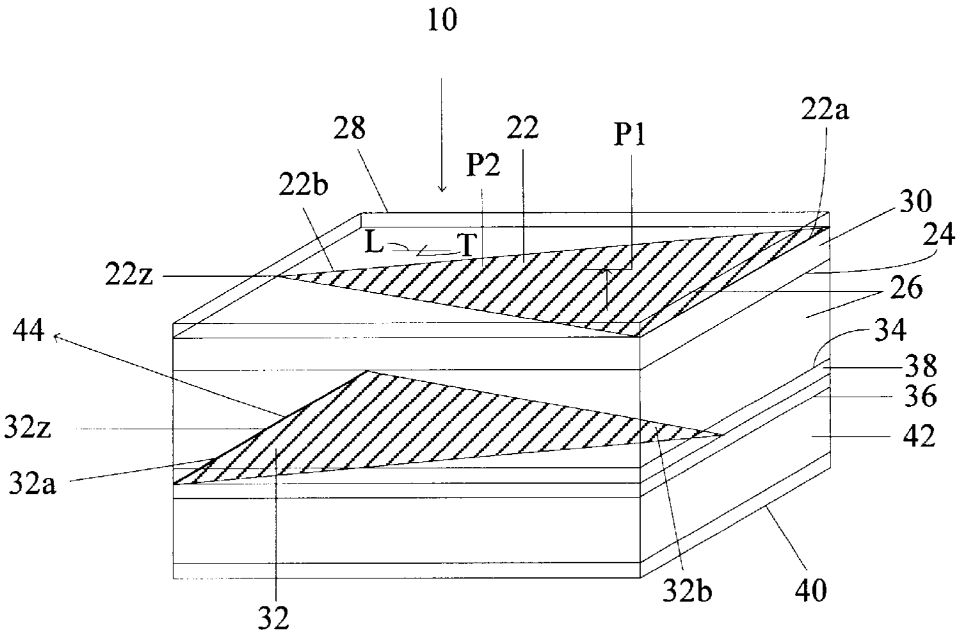
FIG. 2B illustrates a perspective view of the coupling device of FIG. 1 with a multiple frequency antenna connected thereto.

In particular reference to FIGS. 2A and 2B, coupler 10 includes an external coupling element 22 that is affixed to an external surface 24 of a dielectric vehicle component, such as a window or front or rear transparent windshield 26, of vehicle 12. In some applications, other known vehicle components such as plastic or fiberglass type panels could serve as a mounting surface. For purposes of disclosure, external coupling element 22 is shown as a flat, plate of electrically conductive (e.g., copper, brass, steel, or aluminum) material that is etched or deposited onto a dielectric substrate 28, substrate 28 being rendered in FIG. 2 (2A and 2B) as being transparent. As disclosed further below in reference to FIG. 8, however, the coupling elements of the present invention need not be flat, but can be curved on one or two dimensions as appropriate to conform to, e.g., a curved vehicle windshield against which the coupling elements are positioned. Such curved or variable surfaces are generally used to place coupler 10 as flush against a surface as possible, to minimize signal loss and maintain good surface support.

Additionally, an external foam adhesive layer 30 having opposed adhesive surfaces is adhered to dielectric substrate 28 with external coupling element 22. Coupling element 22 is positioned between external foam adhesive layer 30 and dielectric substrate 28 as shown. In turn, external foam adhesive layer 30 is adhered to windshield 26, to thereby affix external coupling element 22 to windshield 26. Alternatively, external coupling element 22 can be adhered to windshield 26 using epoxy or resin compounds, glues, bonding agents, or like materials or techniques well known in the art In addition to the above structure, an internal coupling element 32 which in the embodiment shown is configured substantially identical to external coupling element 22 is affixed to an inner surface 34 of windshield 26. While shown in this example as being configured substantially identical to external coupling element 22, however, if desired, to enhance performance, the size of internal coupling element 32 can be proportionately smaller or larger than the size of external coupling element 22.

Furthermore, internal coupling element 32 need not be configured identically to external coupling element 22. Instead, the present coupling elements 22, 32 are configured as appropriate for efficiently transferring signals between the two couplers based on current flowing in the coupler element. Those skilled in the art will readily appreciate that field simulation studies or other known techniques can be used to determine appropriate dimensions for the couplers. In addition, it is anticipated that in actual use the external and internal couplers are likely to not be precisely aligned when installed in some applications.

Each coupler 22, 32, defines a respective centerline 22_z_, 32_z_, and the centerlines 22_z_, 32_z_ should be spaced closely together, i.e., aligned with each other across windshield 26, with the centerlines parallel to each other and the distance between the centerlines minimized.

As further described below, a coupling element can have more than a single arm, especially where multiple frequencies are to be accommodated. For example, the inner and outer coupling elements could each have an even number of substantially equal width arms, with a centerline between the two inner arms, or an odd number of arms with a centerline that is a longitudinal bisector of a central arm, or other widths and arrangements that place the centerline partially over an arm. In either situation, the coupling elements are aligned relative to these centerlines. In addition, the inner and outer coupling elements may have different numbers, or sizes, of arms. For example, an inner coupling element could have, e.g., four arms, with its centerline between the two inner arms, and a corresponding outer coupling element could have three arms, with its centerline along the longitudinal bisector of the central arm. However, these two couplers would still be aligned relative to their respective centerlines. It is preferred that both elements 22, 32 have the same number of arms, however, especially when more than a single frequency is to be coupled by the elements. It is also preferred that the centerlines are substantially centered or not off-set from each other so that the couplers are generally symmetrically positioned relative to the centerline of the opposing coupler.

Like external coupling element 22, internal coupling element 32 can be etched onto a respective dielectric substrate 36, and substrate 36 with internal coupling element 32 held onto windshield 26 by an internal foam adhesive layer 38. Furthermore, a metal or metal-plated ground plate 40 is provided that is separated from dielectric layer 36 by an air-filled or dielectric-filled gap 42. Internal coupling element 32 is electrically connected to (i.e., fed from) wireless telephone 14 via an electrical line 44, which is connected to cradle 18 in this example.

FIG. 2 shows two features of the present invention with respect to the configuration of coupling elements 22, 32 and their orientation relative to each other. In one embodiment, coupling elements 22, 32 are triangular. More specifically, in the embodiment shown in FIGS. 2A and 2B and in general, external coupling element 22 defines a base end 22*a*, a tapered end 22*b*, and consequently is tapered inwardly from base end 22*a* to tapered end 22*b*. Similarly, internal coupling element 32 defines a base end 32*a* and a tapered end 32*b*. As shown in FIG. 2, base end 32*a* of internal coupling element 32 is connected to electrical line 44.

The above configuration of the coupling element of the present invention can be stated somewhat differently. More specifically, external coupling element 22 defines a longitudinal dimension "L" between its ends 22*a*, 22*b* and a transverse dimension "T" that is perpendicular to the longitudinal dimension "L". As shown in FIG. 2B, the surface area per unit length of a first portion "P1" of element 22 that extends across element 22 in the transverse dimension "T" is greater than the surface area per unit length of a second portion "P2" of element 22 that likewise extends across the transverse dimension "T", but nearer tapered end 22*b* than the first portion P1. From yet another aspect, the coupling element of the present invention, using external coupling element 22 as an example, defines a base end 22*a* that is continuous in the transverse dimension "T" and at least one tapered arm that extends longitudinally away from base end 22*a*.

Turning now to the orientation of coupling elements 22, 32 relative to each other, in accordance with the present invention internal coupling element 32 is parallel with and overlaps external coupling 22. Moreover, present principles envision internal coupling element 32 being oriented relative to external coupling element 22 with base end 32*a* of internal element 32 juxtaposed with tapered end 22*b* of external element 22, and with base end 22*a* of external element 22 juxtaposed with tapered end 32*b* of internal element 32.

It can be appreciated in reference to FIGS. 2A and 2B that a straight line connecting tapered end 22*b* of external element 22 with the base end 32*a* of internal element 32 is substantially perpendicular to the planes defined by elements 22, 32. Likewise, a straight line connecting tapered end 32*b* of internal element 32 with base end 22*a* of external element 22 is substantially perpendicular to the planes defined by elements 22, 32. Thus, two elements 22, 32 overlap each other and are oriented face to face, with each element 22, 32 defining a respective tapered direction, and with the elements being oriented relative to each with their tapered directions opposed and with their respective centerlines 22*z*, 32*z* aligned, i.e., with the distances between centerlines 22*z*, 32*z* minimized.

However, it will be appreciated that the two base ends do not have to be precisely overlapping or vertically aligned with each other. RF energy still couples between the elements even when there is an offset or difference in the size of the elements. This potentially affects the efficiency or loss of the coupler, but does not significantly inhibit operation. As stated above, it is also somewhat unlikely that the internal and external coupler elements will have a highly precise alignment when installed on a vehicle "in the field," as opposed to a more highly controlled vehicle factory setting.

The above-disclosed structure provides a low-cost, wide band (multi-frequency) or dual band, glass-mounted radio frequency (RF) coupler 10. Indeed, the above structure is useful for inductively coupling RF energy in one of coupling elements 22, 32 into the other coupling element 32, 22 through a dielectric layer, such as, e.g., windshield 26. Further, by overlapping elements 22, 32 and by gradually increasing the impedance of internal element 32 by tapering its transverse width to a smaller dimension from its source point at its base end 32*a*, while gradually decreasing the impedance of external element 22 by orienting its tapered dimension oppositely to the internal element as described, efficient, broad-band coupling of RF energy from one element 22, 32 to the other element 32, 22 is effected.

Figure 3:
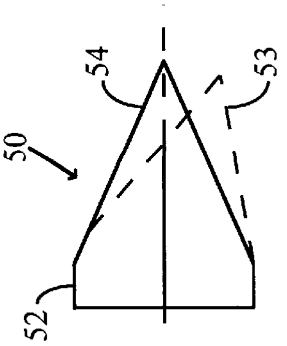
FIG. 3 is a top view of one of the coupling elements illustrated in FIG. 2 with a single arm.

Additionally, the present invention provides other implementations of the coupling element. For example, as shown in FIG. 3, a coupling element 50 can have a rectangular base portion 52 and a triangular arm portion 54 extending away from base portion 52. Coupling elements with only one tapered arm are useful for coupling both of two or more frequencies when the frequencies are odd multiples of each other. That is, they have wavelengths which are odd multiples of each other. This is typically expressed as those frequencies for which a ratio of their respective quarter-wavelengths is an odd number. For example, one signal might have a quarter wavelength of $\lambda/4$ while the other was a quarter wavelength of $n\lambda/4$, where n is an odd positive integer.

Figure 4A:
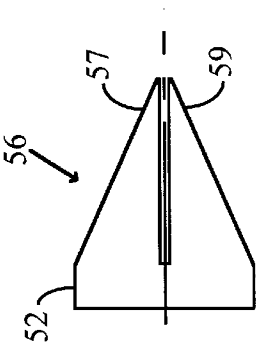
FIG. 4A is a top view of an alternate embodiment of one of the coupling elements shown in FIG. 2 with two arms having two straight center edges and two tapering outer edges.
Figure 4B:
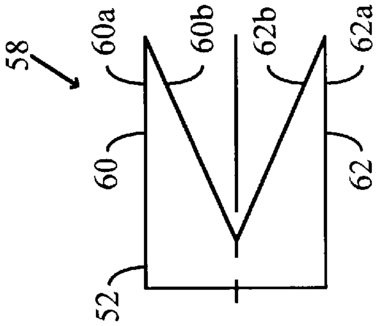
FIG. 4B is a top view of another alternate embodiment of one of the coupling elements shown in FIG. 2 with two arms having two straight outer edges and two tapering center edges.

FIGS. 4A and 4B show alternate arm structures, generally designated 56 and 58, respectively, where a single arm is effectively split in two along a longitudinal axis to establish two halves to increase the frequency bandwidth of the coupler. In FIG. 4A, arm 56 is divided into arms 57 and 59, with an entire side edge of half 57 closely juxtaposed with and parallel to an entire side edge of half 59. In FIG. 4B, arm 58 is split in two along a longitudinal axis to establish two halves 60, 62, with the respective long edges that face each other diverging from each other as shown. Each arm 60, 62 has a respective straight outer edge 60*a*, 62*a*, outer edges 60*a*, 62*a* being "straight" by virtue of being substantially parallel to the direction "D" of taper defined by element 58. Also, each arm 60, 62 has a respective tapered, i.e., angled, center edge 60*b*, 62*b* that establishes an oblique angle relative to the direction "D" of taper. It is to be understood that the arms of the multi-arm couplers disclosed below can be similarly split to increase a coupler's frequency bandwidth.

Figure 4C:
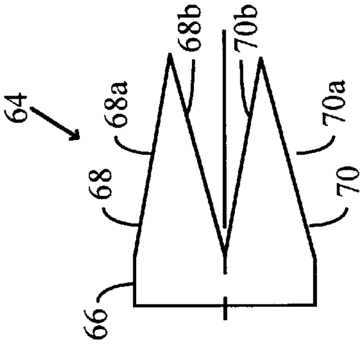
FIG. 4C is a top view of another alternate embodiment of one of the coupling elements having two tapering outer edges and two tapering center edges.
Figure 4D:
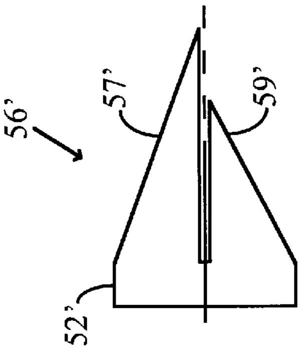
FIG. 4D is a top view of an alternate embodiment of the coupling element of FIG. 4A with arms of differing lengths.
Figure 4E:
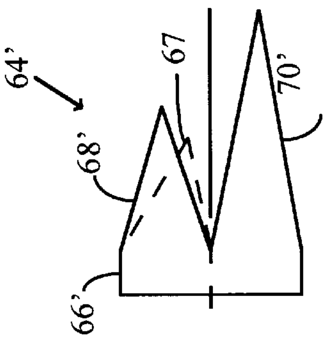
FIG. 4E is a top view of an alternate embodiment of the coupling element of FIG. 4C with arms of differing lengths.

In contrast to arm structures 56 and 58 shown in FIGS. 4A and 4B, a coupling element 64 is shown in FIG. 4C that includes a base 66 and two tandem tapered arms 68, 70 extending away from base 66. Each arm 68, 70 has a respective inwardly angled (from base 66 toward the longitudinal axis "L" of element 64) outer edge 68*a*, 70*a*, and a respective outwardly angled center edge 68*b*, 70*b*. Multiple arms of the same length are useful for improved coupling of single frequencies, while multiple arms of differing lengths are useful for coupling respective multiple frequencies, especially when they are not odd multiples of each other. For example, FIGS. 4D and 4E illustrate different length arms being used in two arm couplers, with a pair 57', 59' in arm set 56', and pair 68', 70' in set 64', with the differences being exaggerated for clarity.

Furthermore, as will be apparent to those skilled in the art, the invention is not limited to the specific triangular shapes used for clarity in illustrating the various embodiments of coupling elements in FIGS. 3–4E, and as discussed further below. Other triangular shapes which are not right angle or isosceles triangles can be employed as illustrated by dashed line 53 in FIG. 3 and line 67 in FIG. 4E. Each of these configurations may also use a "centerline" for aligning coupler elements with reversed tapers that for convenience does not extend through the center of the base of the arm, or of the triangle.

Figure 5A:
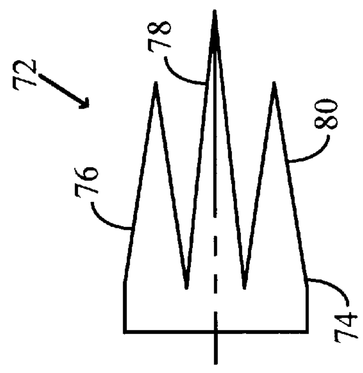
FIGS. 5A, 5B, and 5C are top views of another alternate embodiment of one of the coupling elements having three tapered arms of two different lengths, three different lengths, and the same length, respectively.

The present invention also envisions that more than two arms can be incorporated into the coupling element of the present invention, depending on the number of frequencies to be coupled or to increase the frequency bandwidth. For example, FIG. 5A shows a coupling element 72 having a rectangular base 74 and three triangular-shaped arms 76, 78, 80, extending away from base 74, to couple three frequencies across the windshield. As shown in FIG. 5A, both edges of each arm 76, 78, 80 are angled inwardly from base 74 relative to the longitudinal axis of element 72. Further, as shown in FIG. 5A the length of arm 78 is longer than the lengths of arms 76, 80 to facilitate coupling more than one frequency. Specifically, arm 78 is configured for coupling at least a first frequency (and odd multiples), and arms 76, 80 are configured for coupling at least a second frequency.

Figure 5B:
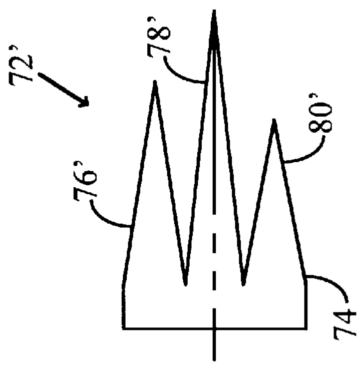
Figure 5C:
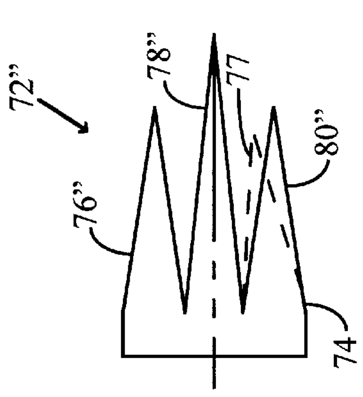
Figure 5D:
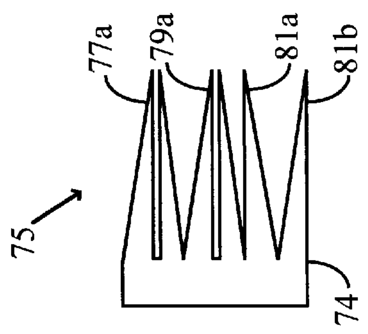
FIG. 5D is a top view of another alternate embodiment of one of the coupling elements having three tapered arms that are subdivided into six.

The length of arm 80 can be shorter or longer than the length of arm 76 (and 78), for coupling yet a third frequency, or set of frequencies. This is illustrated in FIG. 5B, where arm 80' is shorter than arms 76' and 78'. In FIG. 5C, coupler arms 76", 78", and 80" are shown having the same length to improve the bandwidth of a multi-frequency antenna, with dashed line 77 added to illustrate alternative triangular arrangements (non isosceles or right). In FIG. 5D arms 77, 79, 81, have been subdivided to provide further bandwidth improvement. However, those skilled in the art will recognize that a point of diminishing returns is generally reached when subdividing arms too many times, as compared to the manufacturing cost and constraints to do so. FIG. 5D also illustrates the point that the arms need not be subdivided in the same shape, although generally desired, which principle is applicable to other configurations as well.

Figure 6A:
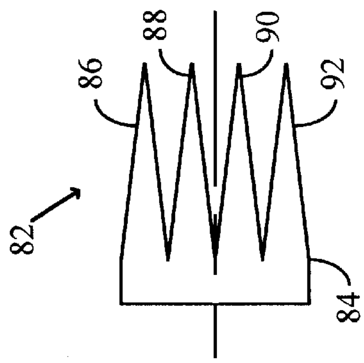
FIGS. 6A and 6B are top views of another alternate embodiment of one of the coupling elements having four tapered arms with the same and with different lengths, respectively.
Figure 6B:
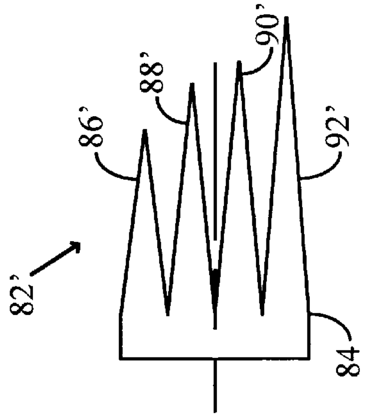

The above principles can be extended to add additional coupling element arms to couple additional (i.e., four or more) frequencies across a vehicle component or windshield. For example, FIG. 6A shows a coupling element 82 having a rectangular base 84 and four triangular-shaped arms 86, 88, 90, 92 extending away from base 84. The lengths of arms 86–92 can be the same as each other, for improved coupling of a single frequency, or the lengths can be established to be different from each other, as appropriate to couple four respective different frequencies. For example, FIG. 6B shows a coupling element 82' having four triangular-shaped arms 86', 88', 90', 92' extending away from base 84, each with a different length.

Figure 7A:
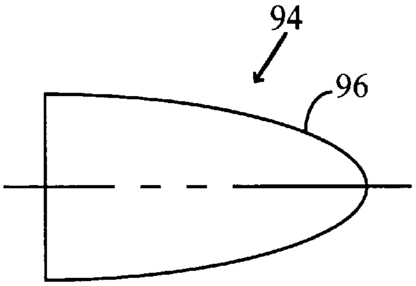
FIGS. 7A and 7B are top views of preferred coupling elements with single and double arms, respectively, each having a curved, tapering outer edge, the curvature of which is defined by an exponential function.
Figure 7B:
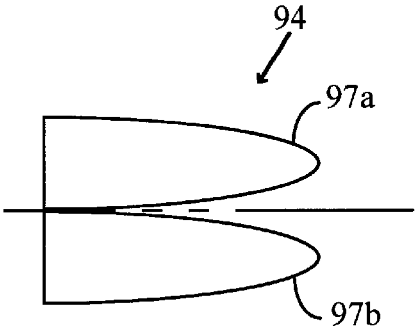
Figure 7C:
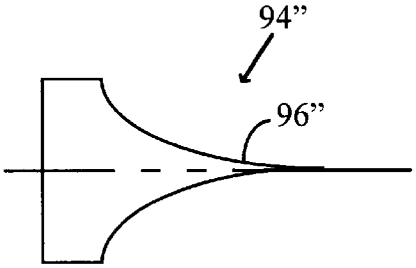
FIG. 7C is a top view of a preferred coupling element with a curved, tapering outer edge, the curvature of which is inward.
Figure 7D:
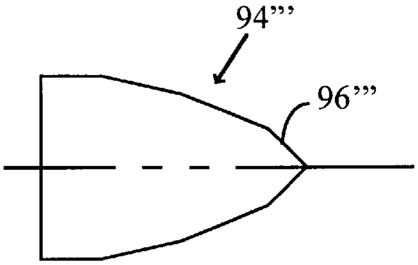
FIG. 7D is a top view of a preferred coupling element with a stepped, tapering outer edge.

In contrast to the elements shown above, FIG. 7A shows an element 94 that has a curved, inwardly tapering outer edge 96. The outer edge 96 of element 94 preferably has a curvature defined by an exponential function or predefined shape to provide better impedance matching, and such a configuration might perhaps be preferred over straight tapers. Alternatively, the curvature of outer edge 96 can be defined by a quadratic function or other curve. Such curved edges can also be used on coupler configurations having multiple arms as discussed above, where desired, which is illustrated by the two arms 97*a* and 97*b* in FIG. 7B. Curved edges of the coupler arms could slope inward as shown by outer edge 96" of element 94" in FIG. 7C, although not generally as useful for matching impedances, and could also be broken into a series of discrete angled or stepped elements as shown by outer edge 96'" of element 94'" in FIG. 7D.

Figure 8:
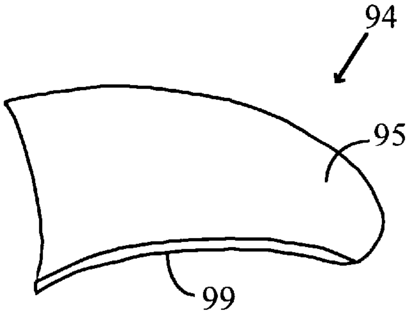
FIG. 8 is a perspective view of a coupling element, the major surface of which is curved in two dimensions to conform to the shape of a curved vehicle window.

Additionally, FIG. 8 shows that element 94 defines major surface 95 that is curved in two dimensions, to substantially conform to a curved vehicle windshield. It is to be understood that the other coupler elements described herein can define curved major surfaces to conform to vehicle surfaces or windshields. In the embodiment shown in FIG. 8, major surface 95 is established by metal that is etched or deposited onto a thin, flexible dielectric substrate 99. However, the conductive material can be cast, extruded, stamped, or otherwise formed to achieve such curved shapes as desired. The variations in surface shape also need not be in the form of smooth curves, but could be implemented as a series of small steps or smaller surfaces joined at angles. Those skilled in the art will readily understand the formations desired to substantially conform to or approximate a given mounting surface, while not creating undesirable loss or extraneous radiation patterns.

Further, the coupling element of the present invention can be modified without departing from the scope of the present invention to fit into a relatively small enclosure that otherwise would have insufficient dimensions to accommodate the element, such as where the wavelength, or quarter wavelength, is of such a value that coupler arm is longer than desired for manufacturing or aesthetic purposes. This aspect is shown in FIG. 9A, which shows a coupling element 100 having a base 102 at which electrical connection is made for signal input/output, and first and second arms 104, 106 extending away from base 102.

Figure 9A:
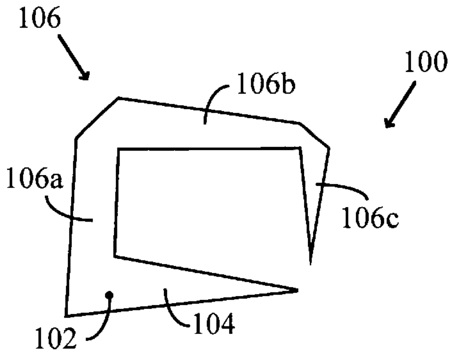
FIGS. 9A and 9B are top views of another alternate embodiment of one of the coupling elements having two tapering arms, each with at least two segments positioned at angles to each other to facilitate mounting within a comparatively small enclosure.

Like the elements described previously, the connection to element 100 shown in FIG. 9A is made at the base of the element. Unlike the elements shown previously, however, second arm 106 does not define a single axis along its length, but rather second arm 106 is bent into three segments 106*a*, 106*b*, 106*c* with contiguous segments being preferably perpendicular to each other and with successive segments (from base 102) being progressively transversely thinner, owing to the fact that second arm 106 is continuously tapered from base 102 throughout its length. Thus, it will be appreciated that segment 106*b* is oriented in the longitudinal direction whereas arms 106*a*, 106*c* are oriented transversely.

Figure 9B:
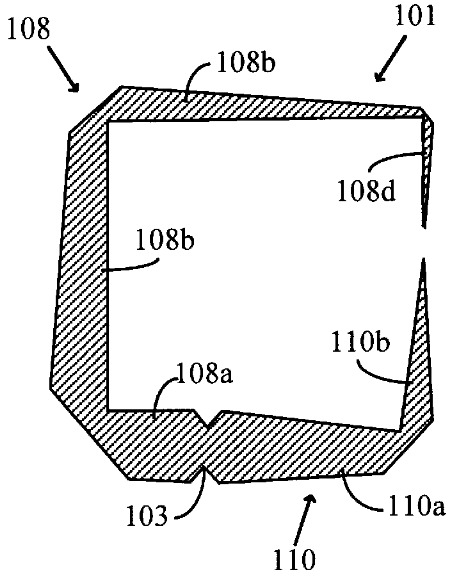

FIG. 9B shows a coupling element 101 having base 103 (at which electrical connection for input/output is made) that is similar to coupling element 100 shown in FIG. 9A, except that both first and second arms 108 and 110 are bent into multiple segments. Specifically, as shown, first arm 108 is bent into four segments 108*a*, 108*b*, 108*c*, and 108*d*, and second arm 110 has two similarly tapered segments 110*a* and 110*b*, with contiguous segments being perpendicular to each other and with successive segments (from base 103) being progressively transversely thinner. It is to be understood that the coupling elements shown in FIGS. 9A and 9B, like element 22 shown in FIG. 2, are used in conjunction with another like element with the tapered end of one element being juxtaposed with the base end of the other.

Those skilled in the art will understand that the arm segments discussed above need not be positioned perpendicular to each other. Each segment in such an arm can be joined at various angles to adjacent segments, with 90 degrees being typical, but not a required angle. For example, a series of arm segments can be formed at 120 degrees, or other angles, to each other forming a more complex geometric shape. The angles can also be less than 90 degrees, although this is more limiting to the overall arm length. In addition, more than three or four segments can be used to achieve the desired length., and for some applications, each arm can have a single segment.

Figure 10:
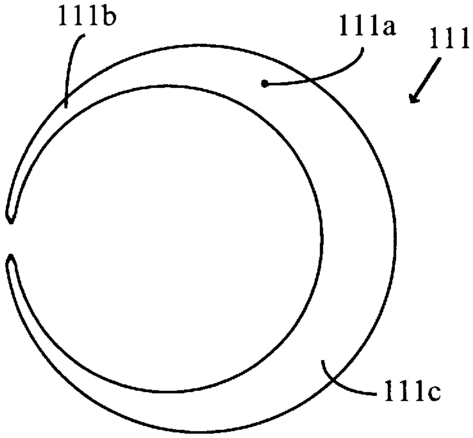
FIG. 10 is a top view of another alternate embodiment of one of the coupling elements, having a sickle shape.

FIG. 10 shows still another coupling element 101 of the present invention having a sickle shape. Electrical connection is made at a point 111*a*, which acts like a base 102 or 103 and establishes two arms 111*b*, 111*c*, one of which is shorter than the other for coupling respective different frequencies. As above, the two arms can also be made the same length as desired for coupling certain frequencies, or even split into halves (parallel arms) to increase the bandwidth.

It is to be understood that the coupling elements shown in FIGS. 2–10, like element 22 shown in FIGS. 2A and 2B, are used in conjunction with another like element with the tapered end of one element being juxtaposed with the base end of the other in the same general manner.

Returning to FIGS. 1 and 2 (2A and 2B), external coupling element 22 is connected at or near its base end 22*a* to a radiator, generally designated 112 (FIGS. 1 and 2), that has first and second elongated, rigid, electrically conductive radiating elements 114, 116. Thus, external coupling element 22 establishes a mount for radiator 22. Preferably, an angle α is established between coupler 10 and radiator 112 as appropriate such that radiator 112 is oriented vertically as shown in FIG. 1 when coupler 10 is mounted on a vehicle surface such as windshield 16. This allows radiator 112 to be substantially vertical.

Radiating elements 114, 116 can be manufactured using several different materials such as metal coated plastic or copper, brass, aluminum, steel, etc. The choice of materials will depend in large part on the frequencies of interest and corresponding loss imparted by the specific material. That is, the material is chosen to minimize loses where possible. These may be coated using known techniques or materials for protection, anodized in the case of aluminum, or the entire assembly may be covered by a compact radome to protect radiators from the elements or damage from the environment. Anodized elements and radomes add an ability for customization with color.

As shown in FIG. 2A, radiating elements 114, 116 are separated from each other and are attached, as by welding, brazing, soldering, or making integral with, a common electrically conductive base 118 as shown. Or, when the radiating elements are metal-coated plastic, the elements can be glued or otherwise bonded to the base.

When the radiators are integrally formed as a single unit, they can be manufactured using well known techniques from materials in bar, wire, or sheet form that are configured with segments that are radiator element length emanating or extending outward from a central portion that becomes conductive base 118 when the segments are folded upward to form antenna 112. An example of this is shown in reference to FIGS. 17 and 18 below.

Preferably, radiating elements 114, 116 are made of metal or are metal plated plastic, to render elements 114, 116 electrically conductive. While FIG. 2A shows that base 118 is disc-shaped, it is to be understood that base 118 can have other shapes, e.g., base 118 can be (when viewed from directly above) elliptical, triangular, square, other rectangular, or sickle-shaped.

In the particular embodiment shown in FIG. 2A, each radiating element 114, 116 includes a respective curved outwardly-oriented surface 114*a*, 116*a* and a respective flat, rectangular inwardly-oriented face 114*b*, 116*b*. However, like base 118, radiating elements 114, 116 can have elliptical, sickle-shaped, triangular, or rectangular transverse cross-sections. Furthermore, radiating element 114 can have a shape that is different from radiating element 116, provided that radiating elements 114, 116 are configured for optimally radiating their respective frequencies. In addition, the radiating elements are not required to have straight side edges but can vary in shape along their vertical extent as well, such as by having an undulating cross-sectional variation, such as when certain aesthetics are desired.

The inwardly-oriented faces 114*b*, 116*b* of radiating elements 114, 116 face each other. If desired, however, each radiating element 114, 116 can be tapered away from base 118, in which case the respective lengths of the radiating elements 114, 116 are adjusted as appropriate to establish quarter wavelength radiating elements per the principles set forth below.

Specifically, in accordance with the present invention, first radiating element 114 is optimally configured for conducting signals in a first frequency band, whereas second radiating element 116 is optimally configured for conducting signals in a second frequency band. In the preferred embodiment, the optimum configuration is achieved by establishing the length "L1" of first radiating element 114 to be substantially equal to an odd multiple of one quarter of the free space wavelength of the center frequency of the first frequency band. That is, $L1=2n+1(\lambda/4)$ where λ is the wavelength of the frequency of interest to be transferred by the coupler, and n is zero or a positive integer. Likewise, the length "L2" of second radiating element 116 is substantially equal to an odd multiple of one quarter of the free space wavelength of the center frequency of the second frequency band.

Figure 11A:
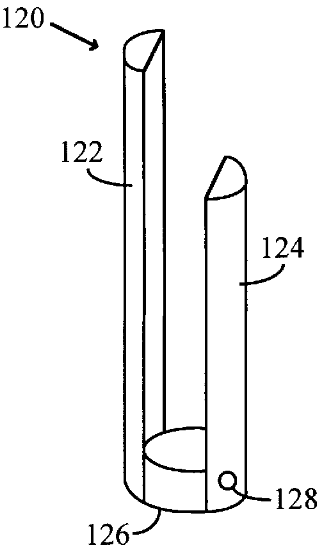
FIGS. 11A–11C are perspective views of alternative embodiments of the present radiator.
Figure 11B:
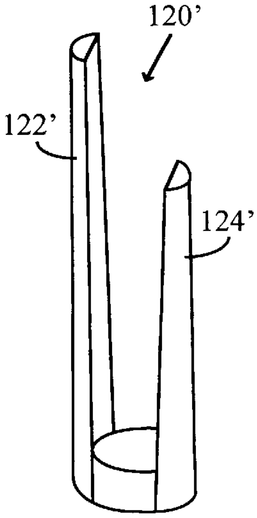
Figure 11C:
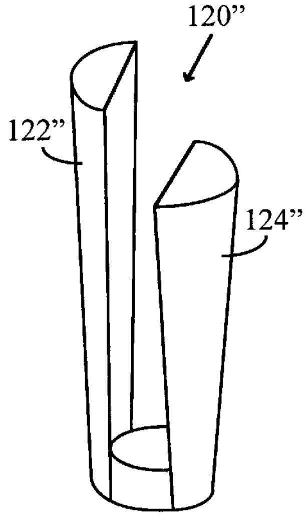

FIG. 11A shows a radiator 120 that is in all essential respects identical to radiator 112 shown in FIG. 2B, with the following exception. First and second radiating elements 122, 124 are fastened to a solid metal or metal-coated plastic cylindrical base 126 as shown by a fastener 128 that extends through elements 122, 124 and base 126. The fastener 128 can be, e.g., a set screw, rivet, pin, or bolt. Such fasteners may also allow radiator elements to be secured at various angles to a base for achieving vertical alignment on slanted or sloped surfaces. FIGS. 11B and 11C show exemplary outlines for when tapered sides or shapes, as discussed below, are used for the radiator elements, which can also be done for other embodiments such as in FIG. 2A. FIG. 11B has inwardly tapered sides toward the top of radiator elements 122', 124' in antenna 120', and FIG. 11C shows outwardly tapered sides toward the top of radiator elements 122", 124" in antenna 120".

Figure 12:
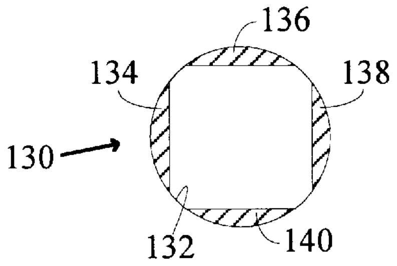
FIG. 12 is a cross-sectional view of another alternative embodiment of the present radiator, as would be seen along the line 12—12 in FIG. 2A.
Figure 13:
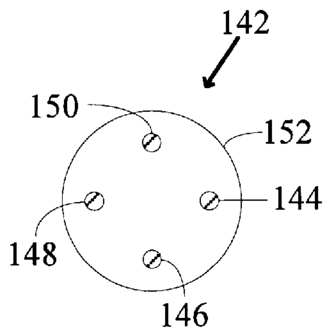
FIG. 13 is a cross-sectional view of another alternative embodiment of the present radiator, as would be seen along the line 12—12 in FIG. 2A.

Moreover, the radiator of the present invention can be configured for optimally radiating more than two frequencies. For example, FIG. 12 shows a radiator 130 having a base 132 to which is connected first through fourth radiating elements 134, 136, 138, 140. It is to be understood that each radiating element 134, 136, 138, 140 has a length that is appropriate for configuring the particular element to optimally radiate and/or receive a respective frequency, using the principles discussed above and well known in the art. Alternatively, in lieu of the particular radiating element structures shown above, FIG. 13 shows that a radiator 142 can include electrically conductive elongated wire radiating elements 144, 146, 148, 150 that are embedded in or otherwise attached to a base 152. It is to be understood that each radiating element 144, 146, 148, 150 has a length that is appropriate for configuring the particular element to optimally radiate and receive a respective frequency, using the principles discussed above.

Figure 14:
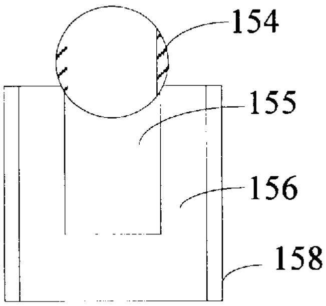
FIG. 14 is a cross-sectional view of another alternative embodiment of the present radiator, as would be seen along the line 12—12 in FIG. 2A, for use apart from a vehicular windshield, showing a feed circuit or connection mechanism.
Figure 15:
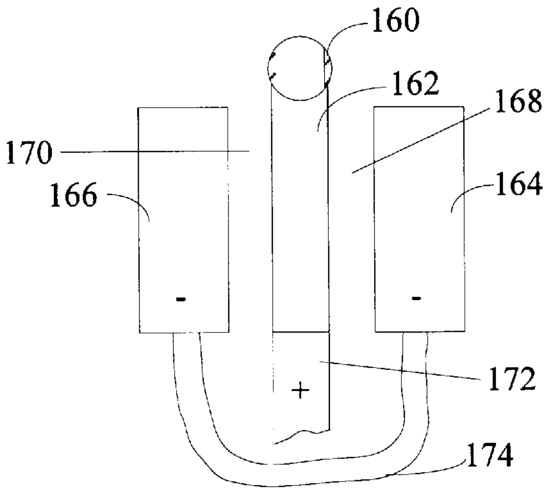
FIG. 15 is a schematic, partially sectional top view of another alternative embodiment of the present radiator for use apart from a vehicular windshield, showing a feed circuit or connection mechanism.
Figure 16:
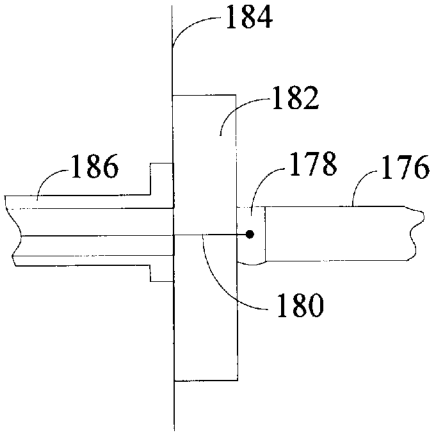
FIG. 16 is a schematic side view of still another alternative embodiment of the present radiator for use apart from a vehicular windshield, showing a feed circuit or connection mechanism.

FIGS. 14–16 show embodiments of the present multi-frequency radiator in applications other than the application discussed above (in which the radiator was associated with a coupler for coupling RF energy across a vehicle windshield). For example, in FIG. 14, a radiator 154, that is in all essential respects identical to radiator 112 shown in FIGS. 1 and 2B, is attached to a metal plate 155, and plate 154 is embedded in or etched onto a dielectric substrate 156. In turn, dielectric substrate 156 is disposed on a metal ground plate 158 to establish a microstrip feed line. It is to be understood that metal plate 155 establishes the antenna feed. With this structure, radiator 154 can be used, e.g., on a vehicle to radiate and receive two frequencies as discussed above.

FIG. 15 shows a different physical implementation of the principle discussed above that is a coplanar waveguide feed. More particularly, a radiator 160 is attached to a metal feed plate 162, and metal ground plates 164, 166 are positioned on respective sides of feed plate 162 and are laterally spaced therefrom. Dielectric strips 168, 170 are respectively sandwiched between ground plates 164, 166 and feed plate 162 as shown.

The above structure is connected to an antenna lead, which is shown, in FIG. 15, as a coaxial cable having a center feed conductor 172 and ground jacket wires 174. The center feed conductor 172 is connected to feed plate 162, while ground jacket wires 174 are connected to ground plates 164, 166.

Yet another physical implementation of the above principle is shown in FIG. 16, wherein a multi-element radiator 176, that is in all essential respects identical to the radiator 112 shown in FIGS. 1 and 2B, includes a base 178, and a feed wire 180 is attached to or embedded in base 178, as shown. Base 178 is positioned against a dielectric layer 182, and a metal ground plate 184 is positioned against dielectric layer 182 opposite base 178. An annular shield element 186 coaxially surrounds feed wire 180. As the skilled artisan will recognize, feed wire 180, like the other feed elements disclosed above, is electrically connected to appropriate antenna feed components.

Figure 17A:
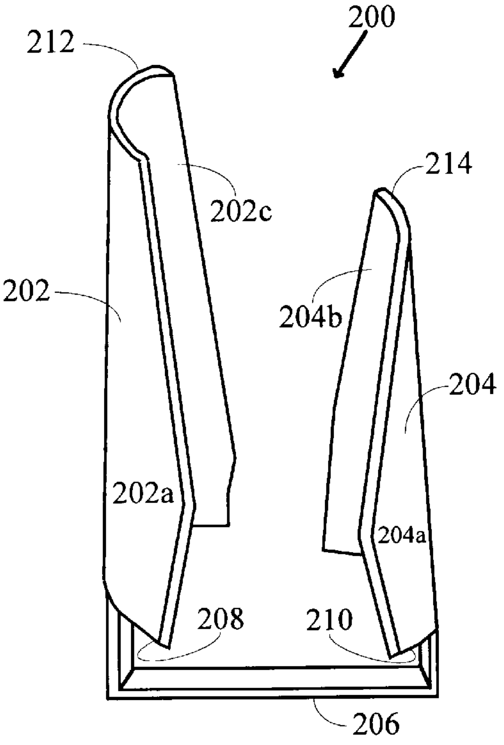
FIGS. 17A and 17B are perspective views of another alternate embodiment of the present radiator, showing radiating elements that are tapered and curved.
Figure 17B:
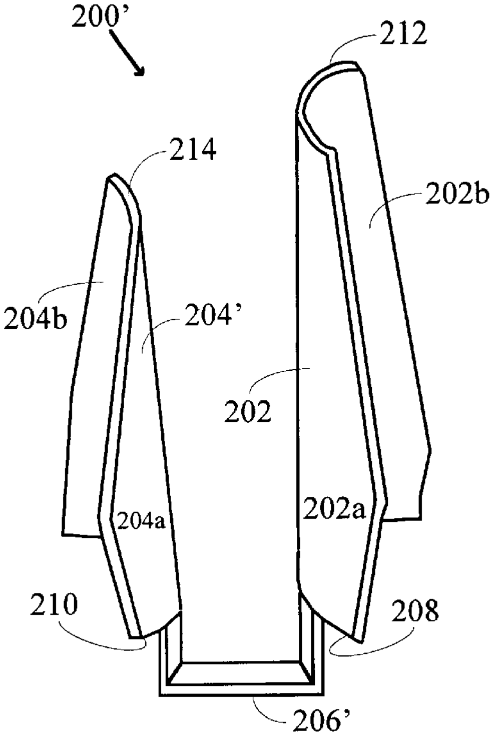

Turning now to FIGS. 17A and 17B, a radiator, generally designated 200, has first and second elongated, rigid, electrically conductive radiating elements 202, 204. As shown in FIG. 17 (17A, 17B), radiating elements 202, 204 are separated from each other and are attached, as by welding, brazing, soldering, or making as an integral part with, a common bar-like electrically conductive base 206 as shown. Base 206 can be parallelepiped-shaped, cylindrically-shaped, or other known shapes, before bending.

In the particular embodiment shown in FIG. 17A, each radiating element 202, 204 includes a respective curved outwardly-oriented convex surface 202*a*, 204*a* and a respective curved concave inwardly-oriented face 202*b*, 204*b*. The inwardly-oriented faces 202*b*, 204*b* of radiating elements 202, 204 face each other. If desired, however, radiating elements 202, 204 can be reversed as shown by radiator 200' and radiating elements 202', 204' in FIG. 17B, such that outwardly-oriented convex surfaces 202*a*, 204*a* face each other so that the curve, and here the taper, is toward the outside of the antenna.

Figure 17C:
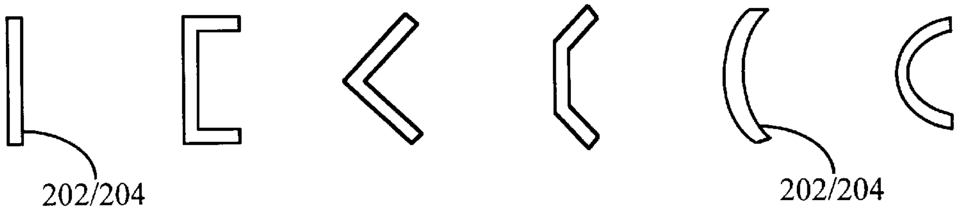
FIG. 17C is a series of alternate cross sectional views for the radiator of FIGS. 17A and 17B.

As shown, base 206 (206') is connected to or more preferably made integrally or as a single unit with respective bases 208, 210 of radiating elements 202, 204. Each element 202, 204 defines a respective apex 212, 214 that is opposed to its respective base 208, 210. The faces 202*a*, 202*b*, 204*a*, 204*b* of elements 202, 204 diverge from apexes 212, 214 to bases 208, 210 as shown. Stated differently, elements 202, 204 are tapered from their respective bases 208, 210 to their apexes 212, 214. Alternatively, faces 202*a*, 202*b*, 204*a*, 204*b* can be reverse tapered, flat and/or non-tapered, e.g., rectangular or other geometric pattern. A few examples of such patterns, which the invention is not limited to, are shown in FIG. 17C. In any case, elements 202, 204 can be made from a flat piece of metal or metal-coated plastic with base 206 extending therebetween and then bent or otherwise formed into the configuration shown, or elements 202, 204 can be machined, cast, or molded into the configuration shown.

Figure 18A:
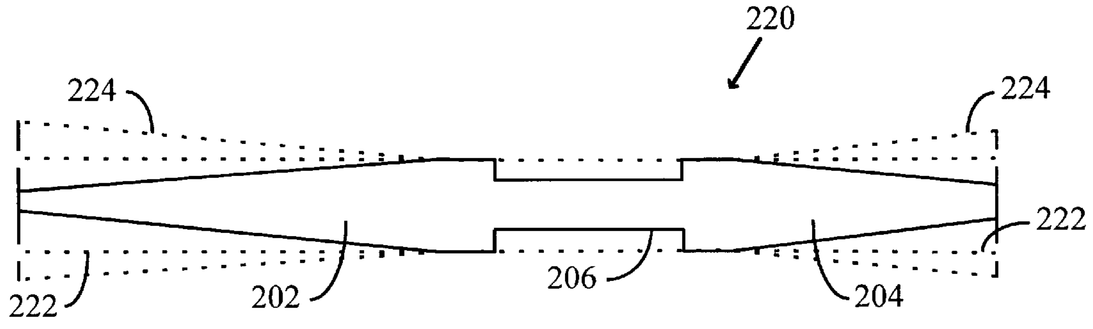
FIGS. 18A–18C are a top and side views of material being formed into the embodiment of FIG. 17.
Figure 18B:
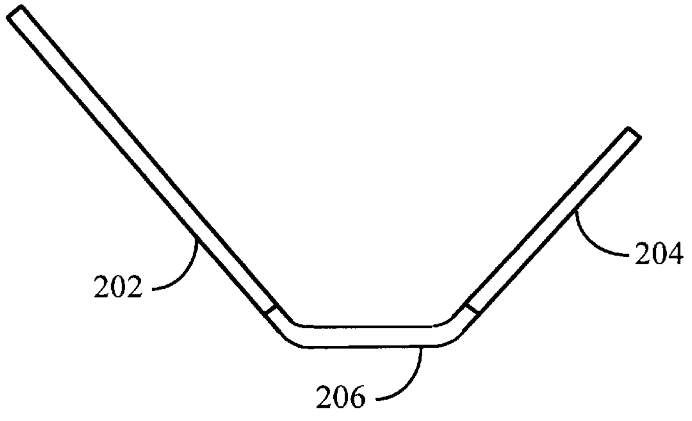
Figure 18C:
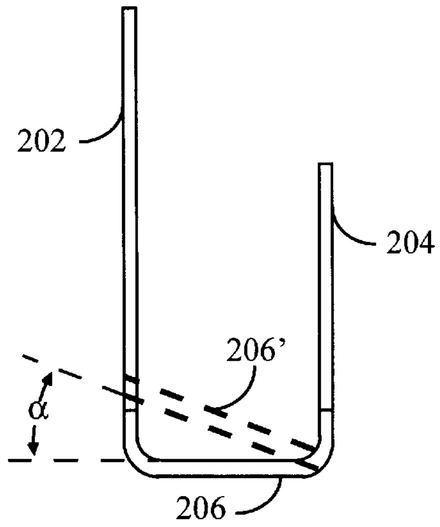

One method of manufacturing a radiator 200 with radiating elements 202, 204 and common conductive base 206 is shown in FIGS. 18A–18C. In FIG. 18A, a flat piece of conductive material 220 such as copper or brass plate is formed into a desired shape according to the final width desired, and the length of each radiating element 202, 204 and conductive base 206. Here, material 220 has a tapered shape, and the base portion is narrower, because of the final shape desired, however, this is not required. The tapering can also be curved or arcuate instead of straight transitions.

In FIG. 18A, dashed lines are used to indicate alternative shapes for material 220. For example, dashed line 222 represents an outline for material 220 when not tapered in a transverse direction such as when non-tapered plate or bar stock is used. Dashed line 224 represents an outline for when reverse tapered material is used. That is, material 220 is wider on the outer ends and subsequently the top of the radiating elements, when bent. It will be readily understood that a mixture of these and other shapes, such as in and out curves or offsets, can also be used as desired. This provides an antenna with improved availability and efficiency for multi-frequency signal transfer, while allowing for aesthetic considerations as well, when desired. A variety of known manufacturing techniques can be used to shape material 220, which can also be in the form of rods or wires. In addition, only two radiating elements are shown for clarity, with the understanding that additional elements could be used as desired within the same technique.

The material forming radiating elements 202 and 204 is then bent upward as shown in FIG. 18B and finally placed in a vertical alignment to the base as shown in FIG. 18C. It should be noted that base 206, in this and other embodiments, need not form a 90 degree angle with radiating elements 202 and 204. Other angles, as shown by dashed lines for a base 206', may be used to compensate for slanted surfaces the antenna is to be mounted on with respect to a desired vertical inclination. For example, the previously discussed angle $\alpha$ can be used as an angular displacement with respect to elements 202 and 204. At this point the material forming elements 202 and 204 can each be curved to form the final antenna shape of FIG. 17A or 17B. In the alternative, the radiator segments could be curved prior to bending.

In accordance with the present invention, first radiating element 202 is optimally configured for conducting signals in a first frequency band, whereas second radiating element 204 is optimally configured for conducting signals in a second frequency band. In the preferred embodiment, the optimum configuration is achieved by establishing the length "L1" of first radiating element 202 to be substantially equal to an odd multiple of one quarter of the free space wavelength of the center frequency of the first frequency band. Likewise, the length "L2" of second radiating element 204 is substantially equal to an odd multiple of one quarter of the free space wavelength of the center frequency of the second frequency band.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What I claim as the invention is:

1. A coupler for establishing a communication path between a wireless telephone inside a vehicle and the exterior of the vehicle, comprising;

an external coupling element affixable to an external surface of a component of the vehicle, the external coupling element defining a base end and a tapered end, the external coupling element being tapered from the base end to the tapered end; and an internal coupling element affixable to an inner surface of the component of the vehicle and electrically couplable to the wireless telephone, the internal coupling element defining a base end and a tapered end, the internal coupling element being oriented relative to the external coupling element with the base end of the internal element juxtaposed with the tapered end of the external element and the base end of the external element juxtaposed with the tapered end of the internal element.

2. The coupler of claim 1, wherein the component of the vehicle is a window, and each coupling element is associated with a respective adhesive layer for affixing the element to the window.

3. The coupler of claim 2, wherein the external coupling element defines a longitudinal dimension between the ends thereof and a transverse dimension perpendicular to the longitudinal dimension, and the surface area of a first portion of the element extending across the element in the transverse dimension is greater than the surface area of a second portion of the element extending across the element in the transverse dimension when the second portion is nearer the tapered end than the first portion.

4. The coupler of claim 3, wherein the external coupling element defines a base continuous in the transverse dimension and at least one arm extending longitudinally away from the base.

5. The coupler of claim 4, wherein the external coupling element includes two arms in tandem, each arm defining a respective outer edge and a respective center edge, at least one of the edges being oriented at an oblique angle relative to the longitudinal dimension.

6. The coupler of claim 4, wherein the at least one arm includes an outer edge having a curvature defined by an exponential function.

7. The coupler of claim 4, wherein the at least one arm includes a first segment oriented generally longitudinally and a second segment contiguous to the first and bent relative thereto such that the second segment is oriented generally transversely.

8. The coupler of claim 1, wherein the external coupling element is connected to a radiator having plural radiating elements separated from each other and attached to a common base.

9. A dual frequency coupler for establishing a low noise communication path, comprising:

two elements oriented face to face with a dielectric material disposable therebetween, the elements having substantially the same configuration with each element being tapered such that each element defines a respective tapered direction, the elements being oriented relative to each other with their tapered directions being opposed.

10. The coupler of claim 9, wherein one of the elements is an external coupling element affixable to an external surface of a component of a vehicle, the external coupling element defining a base end and a tapered end and being tapered from the base end to the tapered end, the other element being an internal coupling element affixable to an inner surface of the component of the vehicle and electrically connectable to a wireless telephone, the internal coupling element defining a base end and a tapered end, the internal coupling element being oriented relative to the external coupling element with the base end of the internal element juxtaposed with the tapered end of the external element.

11. The coupler of claim 10, wherein the component of the vehicle is a window, and each coupling element is associated with a respective adhesive layer for affixing the element to the window.

12. The coupler of claim 11, wherein the external coupling element defines a longitudinal dimension between the ends thereof and a transverse dimension perpendicular to the longitudinal dimension, and the surface area of a first portion of the element extending across the element in the transverse dimension is greater than the surface area of a second portion of the element extending across the element in the transverse dimension when the second portion is nearer the tapered end than the first portion.

13. The coupler of claim 12, wherein the external coupling element defines a base continuous in the transverse dimension and at least one arm extending longitudinally away from the base.

14. The coupler of claim 13, wherein the external coupling element includes two arms in tandem, each arm defining a respective outer edge and a respective center edge, at least one of the edges being oriented at an oblique angle relative to the longitudinal dimension.

15. The coupler of claim 13, wherein the at least one arm includes an outer edge having a curvature defined by an exponential function.

16. The coupler of claim 13, wherein the at least one arm includes a first segment oriented generally longitudinally and a second segment contiguous to the first and bent relative thereto such that the second segment is oriented generally transversely.

17. The coupler of claim 16, wherein the external coupling element is connected to a radiator having plural radiating elements separated from each other and attached to a common base.

18. A method for establishing a communication path between a wireless telephone within a vehicle and the exterior of the vehicle, comprising the steps of:

providing an external coupling element having a tapered configuration and defining a tapered direction;

providing an internal coupling element having a tapered configuration and defining a tapered direction;

affixing the external coupling element to an outside surface of the vehicle; and affixing the internal coupling element to an inside surface of the window opposite the external coupling element such that the window is sandwiched between the elements and such that the tapered direction of the internal element is opposite the tapered direction of the external element.

19. The method of claim 18, further comprising the step of attaching to the external coupling element a dual frequency radiator having plural radiating elements separated from each other and attached to a common base.

20. The method of claim 19, wherein the coupling elements are etched onto respective substrates made of dielectric material.

21. The method of claim 19, wherein the providing steps comprise forming one or more tapered arms on each element.

22. The method of claim 21, wherein the providing steps comprise providing a preselected bend or curve of at least one arm of at least one element.

* * * * *